United States Patent
Wang

(10) Patent No.: US 9,817,636 B2
(45) Date of Patent: Nov. 14, 2017

(54) GENERATING AN ENTROPY SIGNAL

(71) Applicant: Silicon Laboratories Inc., Austin, TX (US)

(72) Inventor: Xiaodong Wang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 275 days.

(21) Appl. No.: 14/547,894

(22) Filed: Nov. 19, 2014

(65) Prior Publication Data

US 2016/0142070 A1 May 19, 2016

(51) Int. Cl.
*G06F 1/02* (2006.01)
*G06F 7/58* (2006.01)
*H03M 1/12* (2006.01)

(52) U.S. Cl.
CPC .............. *G06F 7/582* (2013.01); *G06F 7/588* (2013.01); *H03M 1/12* (2013.01)

(58) Field of Classification Search
CPC .................................. G06F 7/582; G06F 7/588
See application file for complete search history.

(56) References Cited

U.S. PATENT DOCUMENTS

| | | | | |
|---|---|---|---|---|
| 2003/0034906 A1* | 2/2003 | Ko | ....................... | H03M 1/0845 341/118 |
| 2010/0002877 A1* | 1/2010 | Zhang | .................... | H04L 9/0662 380/46 |
| 2016/0110164 A1* | 4/2016 | Suarez | .................... | G06F 7/588 708/250 |

* cited by examiner

*Primary Examiner* — Tan V. Mai
(74) *Attorney, Agent, or Firm* — Trop, Pruner & Hu, P.C.

(57) ABSTRACT

A method includes using an analog-to-digital converter (ADC) to provide an entropy signal at an output of the ADC. The method includes controlling a reference signal to the ADC to cause an internal noise level of the ADC to correspond to more than one least significant bit (LSB) of the ADC.

18 Claims, 4 Drawing Sheets

GENERATING AN ENTROPY SIGNAL

BACKGROUND

Data that is communicated across a given communication channel or stored in a memory may be encrypted for purposes of securing the data from unauthorized access. Various aspects of cryptography involved in the encryption and decryption of data use pseudo random numbers. As examples, pseudo random numbers may be used for such purposes as generating keys, nonces, one time pads (OTPs) and salts.

SUMMARY

In an example embodiment, a method includes using an analog-to-digital converter (ADC) to provide an entropy signal at an output of the ADC. The method includes controlling a reference signal to the ADC to cause an internal noise level of the ADC to correspond to more than one least significant bit (LSB) of the ADC.

In another example embodiment, an apparatus includes an analog-to-digital converter (ADC), a first voltage source, a second voltage source and a coupling network. The first voltage source provides a first voltage, and the second voltage source provides a second voltage that is less than the first voltage. The coupling network, in a first mode of operation, configures the ADC to convert a time varying analog input signal into a digital output signal, where the configuration includes selectively coupling the first voltage to a reference input of the ADC. The coupling network, in a second mode of operation, configures the ADC to provide an entropy signal, where the configuration includes selectively coupling the second voltage to the reference input of the ADC.

In yet another example embodiment, an apparatus includes an integrated circuit, which includes an entropy source to provide an entropy signal and a pseudo random number generator to generate a pseudo random number in response to the entropy signal. The entropy source includes an analog-to-digital converter (ADC), a voltage source and a coupling network. The coupling network selectively couples the voltage source to a reference input of the ADC to cause an internal noise level of the ADC to correspond to more than one least significant bit (LSB) of the ADC.

Advantages and other desired features will become apparent from the following drawings, description and claims.

DETAILED DESCRIPTION

An electronic system, such as a microcontroller unit (MCU)-based platform, may perform various cryptographic functions for purposes of securing data and accessing secured data. As examples, the secured data may be data that is stored in a protected memory of the electronic system; data communicated within the electronic system; data communicated to another electronic system; and so forth. For purposes of performing cryptographic functions, the electronic system may include an entropy source to provide an entropy signal; a pseudo random number generator to generate pseudo random numbers in response to the entropy signal; and a cryptographic engine that uses the pseudo random numbers for a variety of purposes pertaining to encrypting and decrypting data.

In accordance with example embodiments that are disclosed herein, an analog-to-digital converter (ADC) is used to generate an entropy signal. More specifically, in accordance with example embodiments, a reference signal (a reference voltage, for example) of the ADC is controlled to amplify a noise of the ADC for purposes of generating a digital entropy signal.

Figure 1:
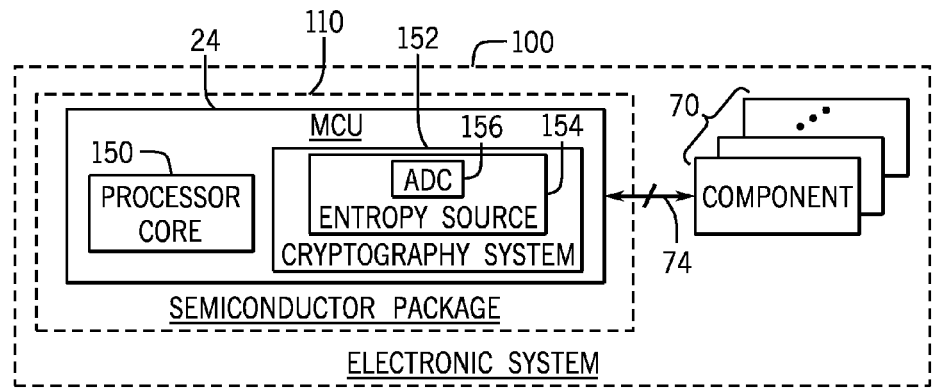
FIG. 1 is a schematic diagram of an electronic system according to an example embodiment.

Referring to FIG. 1, as a more specific example embodiment, an electronic system 100 includes a cryptography system 152, which, in turn, includes an entropy source 154 that uses an ADC 156 to generate a digital entropy signal. The electronic system 100, in accordance with example embodiments, includes a microcontroller unit (MCU) 24, which controls various aspects of one or more components 70 of the electronic system 100. In general, the MCU 24 communicates with the components 70 via communication input/output (I/O) signals 74, which may be wireless signals; hardwired cables-based signals; and so forth, depending on the particular embodiment. As examples, the components 70 may include such components as a lighting element; an electrical motor; a household appliance; an inventory control terminal; a computer; a tablet; a smart power meter; a wireless interface; a cellular interface; an interactive touch screen user interface; and so forth.

As depicted in FIG. 1, in accordance with example embodiments, all or part of the components of the MCU 24 may be part of a semiconductor package 110. In this manner, all or part of the components of the MCU 24 may be fabricated on a single die or on multiple dies, depending on the particular embodiment, and encapsulated to form the semiconductor package 110.

Figure 2:
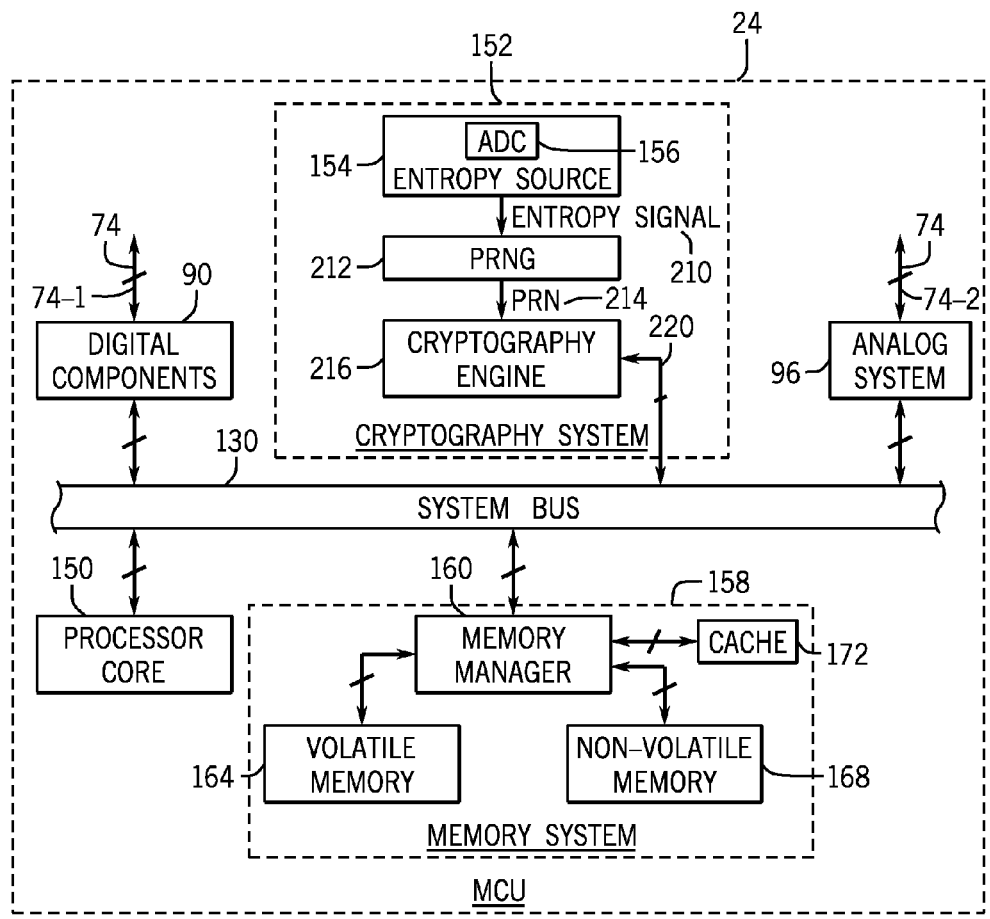
FIG. 2 is a schematic diagram of a microcontroller unit (MCU) of the electronic system of FIG. 1 according to an example embodiment.

Referring to FIG. 2 in conjunction with FIG. 1, in accordance with example embodiments, the MCU 24 contains a processor core 150, digital components 90 and an analog system 96. As an example, the processor core 150 may be a 32-bit core, such as an Advanced RISC Machine (ARM) processor core, which executes a Reduced Instruction Set Computer (RISC) instruction set. In further example embodiments, the processor core 150 may be a more powerful core or a less powerful core, such as an 8-bit core (an 8051 core, for example). Moreover, in accordance with further example embodiments, the electronic system 100 may include multiple processor cores.

The digital components 90 may be, as examples, a Universal Serial Bus (USB) interface; a universal asynchronous receiver/transmitter (UART) interface; a system management bus interface (SMB) interface; a serial peripheral interface (SPI) interface; timers; and so forth. In general, the digital components 90 may communicate with devices that are external to the MCU 24 via associated I/O signals 74-1.

The analog system 96 may include various analog components and systems that receive analog signals, such as analog-to-digital converters (ADCs) and comparators; as well as analog components that provide analog signals, such as current drivers. In general, the analog system 96 may communicate with devices that are external to the MCU 24 via associated I/O signals 74-2.

In accordance with example embodiments, one of the ADCs of the analog system 96 may be used in the entropy source 154 to selectively perform either a "normal" analog-to-digital operation of converting an analog input signal into a digital output signal or an operation in which the ADC generates a digital entropy signal. In this manner, the processor core 150, cryptography system 152 or other entity may control the entropy source 154 to select the mode of operation of the entropy source 154, as further disclosed herein.

Among its other components, the MCU 24 may include a system bus 130 that is coupled to the digital components 90, the analog system 96 and the processor core 150. As depicted in FIG. 2, a memory system 158 may also be coupled to the system bus 130. The memory system 158 may include a memory controller, or manager 160, which controls access to various memory components of the MCU 24, such as a cache 172, a non-volatile memory 168 (a Flash memory, for example) and a volatile memory 164 (a static random access memory (SRAM), for example). In accordance with example embodiments, the volatile memory 164 and the non-volatile memory 168 may form the system memory of the MCU 24. In other words, the volatile memory 164 and the non-volatile memory 168 have memory locations that are part of the system memory address space for the MCU 24.

It is noted that FIG. 2 depicts a general simplified representation of an example MCU architecture, as the MCU 24 have many other components, bridges, buses, and so forth, in accordance with further embodiments, which are not depicted in FIG. 2. For example, in accordance with further example embodiments, the system bus 130 may be an Advanced High-Performance (AHB) bus interconnect that uses slave-side arbitration; and the MCU 24 may have one or more additional buses (an Advanced Peripheral Bus (APB), for example) and one or more corresponding bridges for purposes of allowing master devices (the processor core 150, a DMA engine, and so forth) to communicate with slave devices (memory components, peripheral components, and so forth) of the MCU 24. Thus, many other embodiments are contemplated, which are within the scope of the appended claims.

As depicted in FIG. 2, the cryptography system 152 uses an entropy signal 210 that is generated by the entropy source 154 as an input to a pseudo random number generator 212. In example embodiments, the entropy signal 210 may be a random or near random signal whose amplitude may be described by a probability distribution function (a discrete Gaussian probability distribution function, for example). In response to the entropy signal 210, the pseudo random number generator 212 generates a pseudo random number 214, which is provided to a cryptography engine 216 of the cryptography system 152. The cryptography engine 216, in turn, may use the pseudo random number 214 for purposes of encrypting and/or decrypting data, which may be communicated, communicated to/from the system bus 130 via the inputs and outputs 220 of the engine 216. As examples, the cryptography engine 216 may use the pseudo random number 214 for a variety of cryptographic-related purposes, such as generating keys, generating nonces, generating one time pads (OTPs), generating salts, and so forth.

Figure 3A:
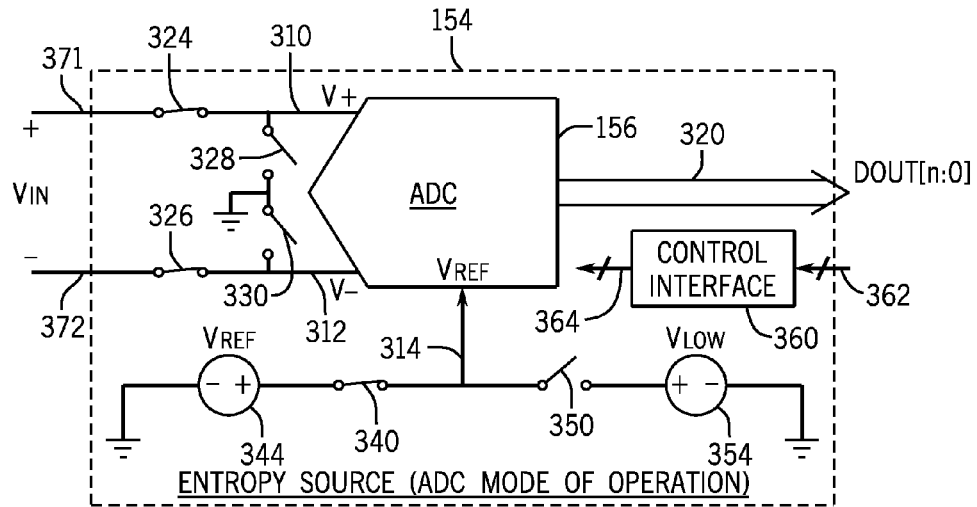
FIGS. 3A and 3B are schematic diagrams of an analog-to-digital converter (ADC)-based entropy source illustrating different modes of operation of the source according to an example embodiment.

FIG. 3A a schematic diagram of the entropy source 154, in accordance with example embodiments. In FIG. 3A, the entropy source 154 is not configured to generate an entropy signal, but rather, the source 154 behaves as a normal ADC in which the source 154 receives an analog input signal and converts the analog input signal into a digital output signal. More specifically, in accordance with example embodiments, the entropy source 154 receives a differential analog input voltage (called "$V_{IN}$" in FIG. 3A) at its inputs 371 and 372 and converts the $V_{IN}$ analog input signal into a multiple bit, digital output signal (called "DOUT[n:0]" in FIG. 3A) at digital outputs 320 of the source 154. In this notation, "DOUT[n:0]" represents an n+1 bit (bits 0, 1 . . . n) digital signal. More specifically, for the analog-to-digital conversion mode of operation of the entropy source 154, the ADC 156 receives the $V_{IN}$ analog input signal at input terminals 310 (a positive input terminal) and 312 (a negative input terminal) from the input terminals 371 and 372, respectively; the ADC 156 samples the received $V_{IN}$ analog input signal; and the ADC 156 generates digital codes for the sampled values, which form the DOUT[n:0] signal.

For purposes of the analog-to-digital conversion, the range of the $V_{IN}$ analog input signal is set by a reference signal, which is received at a reference input 314 of the ADC 156. For the example embodiment of FIG. 3A, the reference signal is an analog voltage (a reference voltage called "$V_{REF}$" in FIG. 3A); and the magnitude of the $V_{REF}$ reference voltage defines the range of the $V_{IN}$ input voltage. In accordance with example embodiments, the DOUT[n:0] signal is a differential digital signal. For these embodiments, the $V_{REF}$ reference voltage sets the range of the $V_{IN}$ input voltage. In this manner, a $V_{IN}$ input voltage at or below the $-V_{REF}$ reference voltage corresponds to the minimum DOUT[n:0] value (zero); a $V_{IN}$ input voltage at or above the $+V_{REF}$ reference voltage corresponds to the maximum DOUT[n:0] value; and for all $V_{IN}$ input voltages in between the $-V_{REF}$ and $+V_{REF}$ reference voltages, the DOUT[n:0] signal represents the corresponding digital code.

In addition to defining the range of the $V_{IN}$ input voltage, the $V_{REF}$ reference voltage also defines how the $V_{IN}$ input voltage is quantized by the ADC 156. In this manner, for purposes of generating its output codes, the ADC 156 quantizes the $V_{IN}$ input voltage into a number of equal, or uniform, analog voltage intervals such that each analog voltage interval corresponds to a particular coded, digital value. The uniform analog voltage interval may be referred to as the least significant bit (LSB) voltage of the ADC 156, as the LSB voltage represents the smallest change in the $V_{IN}$ input voltage, which causes a single LSB change in the ADC's digital output. In accordance with example embodiments, the ADC 156 has an n+1 resolution (i.e., provides an n+1 bit output), and the LSB voltage of the ADC 156 is $V_{REF}/2^{n+1}$.

Figure 4A:
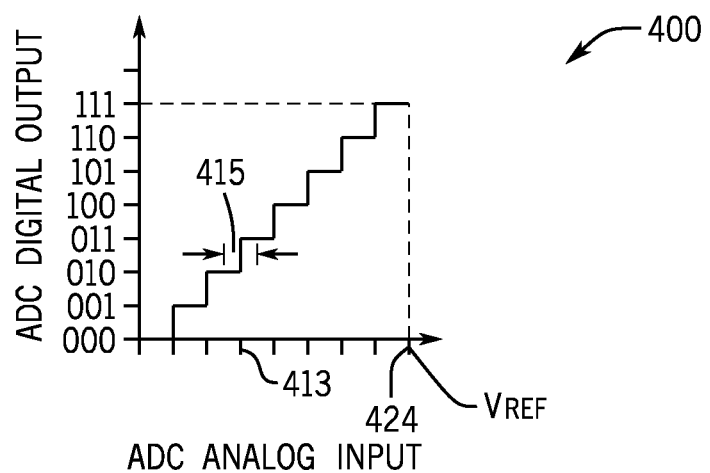
FIGS. 4A and 4B illustrate ADC transfer functions and the effects of noise for different reference voltages.

A transfer function 400 of a simplied, single-ended output ADC is illustrated in FIG. 4A for purposes of illustrating analog-to-digital code conversion by an ADC and how a code transition noise of the ADC affects the conversion. For the example embodiment of FIG. 4A, the ADC has a resolution of three bits and receives a reference voltage called "$V_{REF}$." It is noted that the ADC 156 of the entropy source 154 may provide a differential output signal, may have a greater or lower bit resolution, depending on the particular embodiment.

For the example embodiment of FIG. 4A, an analog input voltage of the ADC is divided into equal segments, where each segment corresponds to an LSB voltage. The ADC effectively quantizes an analog input voltage as belonging to one of these analog voltage segments and provides a corresponding digital code that represents the corresponding digital value. Along the vertical axis (corresponding to the digital output of the ADC), each digital code differs from its adjacent code(s) by one LSB. As examples, the ADC ideally converts an analog input voltage that is within the lowest analog voltage interval into a digital code of "000b," where "b" denotes a binary representation; converts an analog input voltage that is within the next analog voltage interval to a digital code of "001b;" and so forth.

The quantization by the ADC is imperfect and may not exactly following the stair step pattern illustrated in FIG. 4A due at least in part to a code transition noise of the ADC, which introduces an uncertainty in the conversion. As a specific example, this uncertainty is depicted in FIG. 4A at reference numeral 415 for the transition between codes "010b" and "011b," although the other code transitions are similarly subject to the code transition noise and corresponding uncertainty.

The amplitude of the code transition noise, in accordance with example embodiments, may be represented by a probability distribution (a continuous Gaussian probability distribution, for example). The code transition noise may be attributable to any of a number of different factors, such as one or more of the following: noise communicated through the analog inputs of the ADC, noise communicated through the power supply rails of the ADC, noise communicated through the clock signal provided to the ADC, switching noise, thermal noise, and so forth.

In FIG. 4A, the transition boundary between codes 010b and 011b correspond to an analog input voltage 413 and is associated with an uncertainty voltage range 415. Ideally, in the absence of the code transition noise, the ADC converts an input voltage less than the voltage 413 to the code 010b and converts an input voltage greater than the voltage 413 to the code 011b. However, the quantization is imperfect at the voltage 413, as representing by the range 415, which means for $V_{IN}$ input voltages within the range 415, the ADC may produce, in a random fashion, code 010b or code 011b. Similar quantization uncertainties also exist for the other transitions due to the code transition noise. For the example of FIG. 4A, the code transition noise is generally ±½ LSB voltage.

The code transition noise scales with the ADC's LSB voltage. For example, if, due to the code transition noise, an ADC has an error of one LSB voltage for a given $V_{REF}$ reference voltage, in general, doubling the $V_{REF}$ reference voltage reduces the code transition noise to one half of an LSB voltage, and vice versa.

Figure 4B:
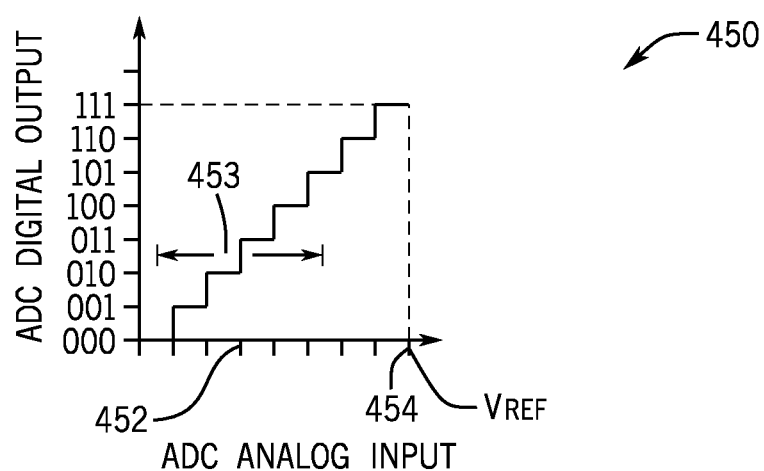

Referring to FIG. 4B in conjunction with FIG. 4A, the increased effect of the code transition noise for a smaller $V_{REF}$ reference voltage can be seen from a corresponding transfer function 450 for the same ADC. In FIG. 4B, the $V_{REF}$ reference voltage has been reduced in magnitude (reduced by a factor of about eight, for example) as compared to its magnitude in FIG. 4A. FIG. 4B illustrates an example input voltage 452 that corresponds to a transition between codes "010b" and "011b." Due to the correspondly reduced LSB voltage, the code transition noise has an increased impact, as a corresponding uncertainty range 453 for the code generation near example voltage 452 spans more than ±4 LSB voltages.

Thus, the output of the ADC has an error voltage component, which is attributable to noise of the ADC; and the magnitude of the error voltage component is a function of the ADC's reference voltage.

Referring back to FIG. 3A, in accordance with systems and techniques that are disclosed herein, the $V_{REF}$ reference voltage of the ADC 156 is regulated such that for the analog-to-digital conversion mode operation of the entropy source 154, the $V_{REF}$ reference voltage has a greater magnitude and for the entropy signal generation mode of the source 154, the $V_{REF}$ reference voltage has a smaller magnitude: a greater magnitude for the $V_{REF}$ reference voltage means that the code transition noise has a lesser effect (in terms of the ADC's LSB voltage) on the ADC output; and a relatively smaller magnitude for the $V_{REF}$ reference voltage means that the code transition noise has a greater effect (in terms of ADC's LSB voltage) on the ADC output. For the entropy signal generation mode of operation, the analog input of the ADC 156 is fixed (grounded, for example) so that the code transition noise of the ADC 156 is amplified for purposes of generating a random or near random digital entropy signal that appears at the output of the ADC 156.

Figure 3B:
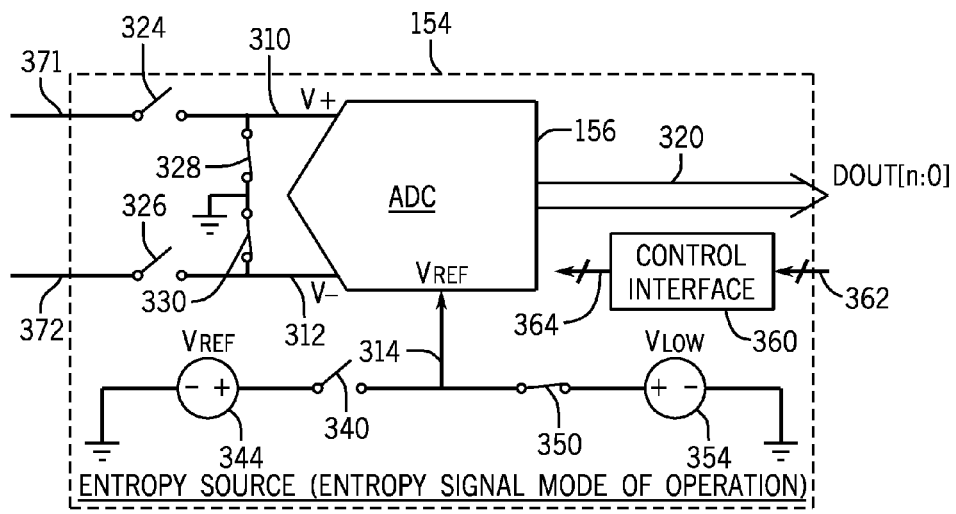

In accordance with example embodiments, the entropy source 154 has various switches (metal oxide semiconductor field-effect-transistors (MOSFETs), for example) for purposes of configuring the ADC 156 to operate either in the analog-to-digital conversion mode of operation as depicted in FIG. 3A or in the entropy signal generation mode of operation, which is depicted in FIG. 3B and described below. In accordance with example embodiments, operations of these switches may be controlled by a control interface 360 of the entropy source 154. In this manner, an entity such as a cryptography engine or the processor core 150 may write to a register of the control interface 360 to control the mode of operation of the entropy source 154. The control interface 360 provides signals on its outputs 362 to control terminals (gate terminals, for example) of the switches for purposes of selectively opening and closing the switches to set the mode of operation for the entropy source 154.

Referring to FIG. 3A, for the analog-to-digital conversion mode of operation of the entropy source 154, switches 324 and 326 are closed to couple analog communication lines 371 and 372, respectively, to the positive 310 and negative 312 inputs of the ADC 156 to allow the ADC 156 to receive the $V_{IN}$ input voltage. Moreover, for the analog-to-digital conversion mode of operation, a switch 340 of the entropy source 154 is closed to couple the reference input 314 of the ADC 156 to a reference voltage source 344, which provides the $V_{REF}$ reference voltage.

The entropy source 154 includes additional switches, which are closed for purposes of configuring the ADC 156 to provide an entropy signal during an entropy mode of operation. This configuration is depicted in FIG. 3B. Referring to FIG. 3B, for the entropy mode of operation, the switches 324, 326 and 340 are opened, and additional switches 328, 330 and 350 (which are open for the analog-to-digital conversion mode) are closed. In this manner, the switches 328 and 330 couple the positive input terminal 310 and negative input terminal 312, respectively, to ground; and the closed switch 350 couples the reference input 314 to a voltage source 354. The voltage source 354 has a magnitude that is less than a magnitude of the reference voltage source 334. In this manner, the magnitude of the voltage source 354 is sufficiently low (two to six times less in magnitude than the voltage of the source 344, for example) such that the error in the output of the ADC 156 is several LSB voltages.

Although ideally, the DOUT[n:0] signal should be a digital "zero" due to the coupling of the ADC's input to ground, due to the noise of the ADC 152 and the amplification of the noise by the lower reference voltage, the DOUT[n:0] output signal of the ADC 156 has a non-zero random component, which varies in amplitude by several LSBs.

Figure 5:
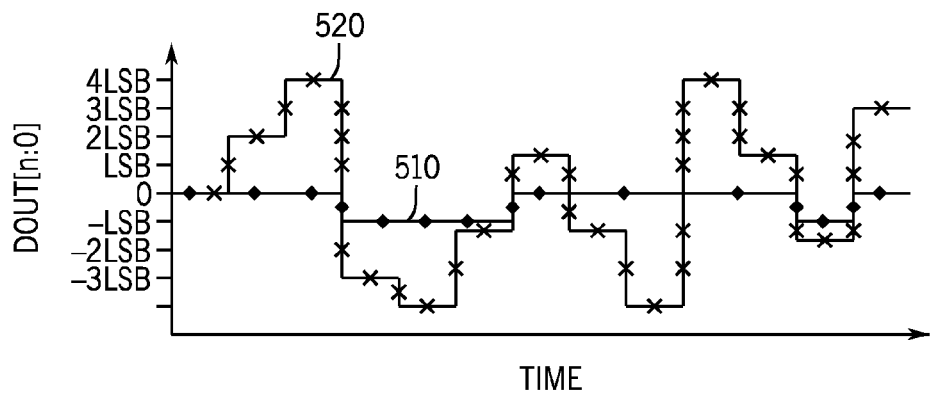
FIG. 5 is a graph depicting an output of the entropy source versus time for different modes of operation of the source according to an example embodiment.

FIG. 5 depicts an output signal 510 of the entropy source 154 during the analog-to-digital conversion mode for a zero input voltage and an output signal 520 of the ADC 156 also for a zero input voltage for the entropy signal generation mode of operation, in accordance with example embodiments. As shown, for the analog-to-digital conversion mode, the ADC output has a variation corresponding to ±one LSB voltage. During the entropy mode of operation, the $V_{REF}$ reference voltage is lowered, which effectively amplifies the code transition noise of the ADC 156 so that the error voltage component (an error component of ±2 to 6 LSBs, for example) that appears as the entropy signal may be significantly greater (four to twelve times greater, as an example) than the error voltage component (±½LSB, for example) that appears in the ADC output during the ADC's analog-to-voltage conversion mode. For the example of FIG. 5, the output signal 520 during the entropy signal generation mode varies by ±4 LSBs.

Figure 6:
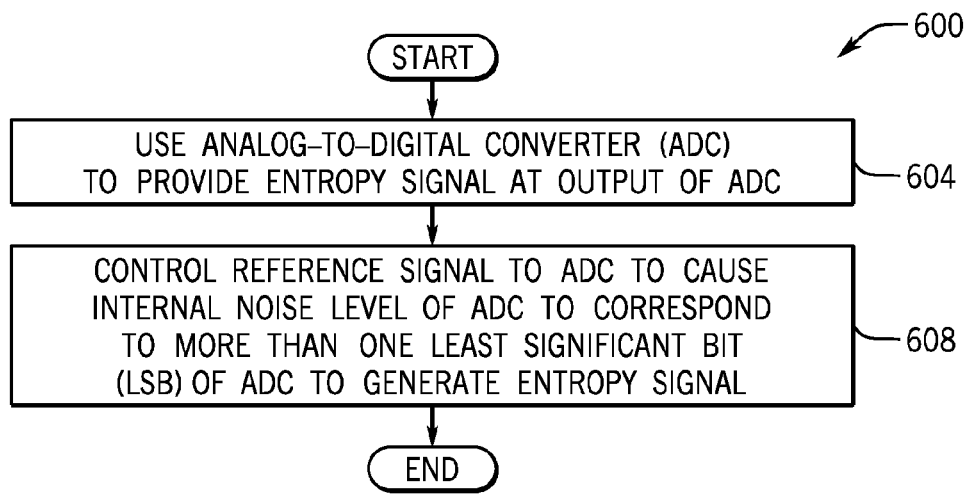
FIG. 6 is a flow diagram depicting a technique to use an ADC to generate an entropy signal according to an example embodiment.

Thus, referring to FIG. 6, in accordance with example embodiments, a method 600 includes using (block 604) an analog-to-digital converter (ADC) to provide an entropy signal at the output of the ADC and controlling (block 608) a reference signal to the ADC to cause an internal noise level of the ADC to correspond to more than one least significant bit (LSB) of the ADC.

A number of potential advantages may be gained using the ADC-based entropy source 154. As examples, the use of an internal noise source of the ADC may make the entropy source less prone to attack. The entropy source may have a relatively wide range of LSB variation. The entropy source 154 may have a relatively simple design. No external noise sources may be used. Other and different advantages may be achieved, in accordance with further embodiments.

While a limited number of embodiments have been disclosed herein, those skilled in the art, having the benefit of this disclosure, will appreciate numerous modifications and variations therefrom. It is intended that the appended claims cover all such modifications and variations.

What is claimed is:

1. A method comprising:
   using an analog-to-digital converter (ADC) to provide an entropy signal at an output of the ADC; and
   controlling a reference signal to the ADC to cause an internal noise level of the ADC to correspond to more than one least significant bit (LSB) voltage of the ADC.

2. The method of claim 1, wherein using the ADC to provide the entropy signal comprises coupling at least one signal input of the ADC to ground.

3. The method of claim 1, wherein controlling the reference signal comprises controlling the reference signal to amplify a noise of the ADC.

4. The method of claim 3, wherein using the ADC to provide the entropy signal is associated with a first mode of operation, the method further comprising:
   using the ADC in a second mode of operation to convert an analog input signal provided to the ADC to a digital output signal,
   wherein:
   the reference signal is regulated to a first level for the first mode of operation, and
   controlling the reference signal comprises regulating the reference signal to a second level greater than the first level for the second mode of operation.

5. The method of claim 4, further comprising operating switches to select either the first mode of operation or the second mode operation.

6. The method of claim 1, further comprising generating a pseudo random number based at least in part on the entropy signal.

7. The method of claim 6, further comprising performing a cryptographic function based at least in part on the pseudo random number.

8. An apparatus comprising:
   an analog-to-digital converter (ADC) having a reference input;
   a first voltage source to provide a first voltage;
   a second voltage source to provide a second voltage less than the first voltage; and a coupling network to:
   in a first mode of operation, configure the ADC to convert a time varying analog input signal into a digital output signal, comprising selectively coupling the first voltage to the reference input of the ADC; and
   in a second mode of operation, configure the ADC to provide an entropy signal, wherein configuring the ADC to provide the entropy signal comprises decoupling the first voltage from the reference input of the ADC and coupling the second voltage to the reference input of the ADC,
   wherein the ADC comprises a digital output that provides an error voltage, and an amplitude of the error voltage is greater for the second mode of operation than for the first mode of operation.

9. The apparatus of claim 8, wherein the coupling network is further adapted to couple an analog signal input of the ADC to ground to configure the ADC to provide the entropy signal.

10. The apparatus of claim 8, wherein the amplitude of the error voltage is four to twelve times greater for the second mode of operation than for the first mode of operation.

11. The apparatus of claim 8, wherein the entropy signal comprises a noise signal having an amplitude that varies by at least two least significant bit (LSB) voltage.

12. The apparatus of claim 11, wherein the coupling network comprises switches that are selectively opened and closed to select the first and second modes of operation.

13. The apparatus of claim 8, further comprising a pseudo random number generator to generate a pseudo random number based at least in part on the entropy signal.

14. The apparatus of claim 13, further comprising a cryptographic system to perform a cryptographic function based at least in part on the pseudo random number.

15. An apparatus comprising:
   an integrated circuit comprising an entropy source to provide an entropy signal and a pseudo random number generator to generate a pseudo random number in response to the entropy signal, wherein the entropy source comprises:
   an analog-to-digital converter (ADC);
   a voltage source; and
   a coupling network to selectively couple the voltage source to a reference input of the ADC to cause an internal noise level of the ADC to correspond to more than one least significant bit (LSB) voltage of the ADC.

16. The apparatus of claim 15, wherein the coupling network is adapted to couple at least one input terminal of the ADC to ground.

17. The apparatus of claim 15, wherein a reference signal coupled to the reference input of the ADC defines an error voltage for the ADC and the error voltage corresponds to multiple LSB voltages for the ADC.

18. The apparatus of claim 17, wherein the entropy signal has an amplitude exceeding two LSB voltages of the ADC.

* * * * *